United States Patent [19]

Horn et al.

[11] Patent Number: 4,644,363

[45] Date of Patent: Feb. 17, 1987

[54] INTEGRATED DUAL BEAM LINE SCANNING ANTENNA AND NEGATIVE RESISTANCE DIODE OSCILLATOR

[75] Inventors: Robert E. Horn, Middletown; Harold Jacobs, deceased, late of West Long Branch, by Lydia S. Jacobs, executrix; Felix Schwering, Eatontown, all of N.J.

[73] Assignee: The United States of America as represented by the Secretary of the Army, Washington, D.C.

[21] Appl. No.: 733,836

[22] Filed: May 14, 1985

[51] Int. Cl.[4] .................... H01Q 13/00; H01Q 15/14; H01Q 3/02; H03B 7/14

[52] U.S. Cl. .................................. 343/785; 343/701; 343/757; 343/763; 343/837; 331/107 DP

[58] Field of Search ............... 343/701, 754, 762, 763, 343/770–772, 785, 786, 834, 910–912, 757, 837; 331/97 DP, 107 R, 96; 333/239, 248

[56] References Cited

U.S. PATENT DOCUMENTS

| | | | |
|---|---|---|---|
| 3,986,153 | 10/1976 | Kuno et al. | 331/107 G |
| 4,203,117 | 5/1980 | Jacobs et al. | 343/701 |
| 4,382,261 | 5/1983 | Friebergs et al. | 343/854 |
| 4,581,591 | 4/1986 | Jacobs et al. | 331/107 DP X |
| 4,590,441 | 5/1986 | Jacobs et al. | 331/107 DP |

OTHER PUBLICATIONS

Horn–"Integrated Tunable Cavity Gunn Oscillator for 60-GHZ Operation in Image Line Waveguide", IEEE Transactions on Microwave Theory and Techniques, vol. MTT-32, No. 2, Feb. 1984, pp. 171–176.

*Primary Examiner*—Marvin L. Nussbaum
*Attorney, Agent, or Firm*—Sheldon Kanars; Jeremiah G. Murray; John T. Rehberg

[57] ABSTRACT

A millimeter wave dual beam line scanning antenna integral with a tunable solid state oscillator is disclosed. The antenna provides two fan-shaped beams from opposite faces and when the antenna is rotated, a roughly conical shaped scan obtains. Furthermore, variation of the oscillator frequency causes a variation in radiation angle and provides two line scanning beams from opposite faces.

16 Claims, 4 Drawing Figures

INTEGRATED DUAL BEAM LINE SCANNING ANTENNA AND NEGATIVE RESISTANCE DIODE OSCILLATOR

The invention described herein may be manufactured, used and licensed by or for the Government without payment to us of any royalty thereon.

BACKGROUND OF THE INVENTION

1. Field of the Invention

The present invention relates to solid state line scanning devices and more particularly to a line scanner having a diode oscillator which is located between two oppositely extending dielectric waveguides with spaced metal stripes on opposite sides.

The present device may find application in radar.

2. Description of the Prior Art

Microwave technology requires various circuit components for use in applications in the fields of radar and communications. Typically such circuit components include filter elements, oscillator sources, and/or scanning antennas for use in beam steering applications. While various circuits for millimeter-wave applications have been described in the literature, there is an ongoing effort to provide simple and low cost devices which are able to perform several circuit functions in one integrated structure.

An earlier dielectric waveguide scanning device is described in U.S. Pat. No. 4,203,117, issued to two of the present inventors, which discloses a dual beam line scanner. The device provides steered fan shaped beams from opposite faces at substantially equal angles of a single semiconductor waveguide. The waveguide has a plurality of equally spaced parallel perturbations, such as metal stripes, attached to one of the two radiation sides or faces, the stripes being transverse to the principal direction of radiation. The angle of scan is selectively controlled by variably biasing a PIN diode that is integrally formed on an adjoining side of the waveguide. However, variation of the PIN bias causes variation in radiated power and there is no simple, effective way of controlling the angle of scan of the beam with respect to the waveguide while maintaining a uniform power output. Furthermore, since the PIN diode is formed by deposition of contiguous layers of semiconductor material directly upon the side of a semiconductor waveguide, should the diode burn out or be damaged, the entire assembly must be discarded and replaced.

Another related device is described in U.S. Pat. No. 4,382,261, issued to two of the present inventors and another, which also discloses a dual beam line scanner having two integral PIN diodes on opposite faces with a dielectric layer under each diode.

A further related device of two of the present inventors is described in copending application Ser. No. 679,970, filed Dec. 10, 1984, and now U.S. Pat. No. 4,590,441, which utilizes a single longitudinal dielectric waveguide with perturbations on its upper surface and a housing with a resonant cavity and diode oscillator. Frequency is controlled by varying bias on the oscillator or on a second varactor diode in a second cavity. The device also contains a reflector located opposite the waveguide on the other side of the oscillator, which serves to reflect energy escaping from the cavity back into the cavity and thence into the single waveguide.

Also of interest is the following publication: IEEE *Transactions on MMicrowave Theory and Techniques,* Vol. MTT-32, No. 2, February 1984, R. E. Horn et al, "Integrated Tunable Cavity Gunn Oscillator for 60-GHz Operation in Image Line Waveguide," pp 171–176, which discusses a mechanically tunable Gunn oscillator coupled to an image line waveguide.

However none of these references shows or suggests a device having the particular structure and advantages of the present invention.

SUMMARY OF THE INVENTION

The present invention provides a dual beam line scanning antenna including a simple means of electronically controlling the angles of scan of the dual beams without incurring any undesirable effects upon radiated power output. The device includes a metal base and two solid elongated dielectric waveguides of rectangular cross section. The two waveguides are attached to a central housing which is supported by the base. A vertical bore is provided in the housing to define a resonant cavity therein. An oscillator diode with two electrical contact points is mounted inside the cavity. The diode oscillates when electrically connected to a DC bias source. Electromagnetic waves propagate from the resonant cavity into both waveguides.

Perturbation surfaces are located along the top surface of one of the waveguides and along the bottom surface of the other waveguide. The perturbation surfaces consist of spaced metal strips which extend laterally across the width and continue along the longitudinal axes of each waveguide.

The spacing between the stripes on each of the waveguides is approximately the same as the wavelength of radiation in the waveguides. As radiation from the oscillator traverses each guide, the perturbation surfaces radiate like small antennas.

Since the perturbation surfaces are on opposite sides of the waveguides, two separate radiation fronts, 180° apart are provided. The wavelength of radiation in the waveguides is determined by the geometry of the resonant cavity and the frequency of the oscillator.

Tuning of the oscillator by varying the DC bias voltage causes variation in the frequency of the diode oscillation and thus causes a small variation in the wavelength of the propagation in the waveguide. Variation of the wavelength of propagation in the guides causes a shifting of the angle of the emitted beams with respect to the wave guides to provide electronic beam scanning.

Each waveguide may be provided with reflectors on the waveguide surface opposite the perturbations. The reflectors reflect the electromagnetic energy which would normally propagate from an unreflective surface and redirect the energy toward the metal stripes or perturbations whence it is radiated outward, thus approximately doubling the power radiated from the perturbations.

The present invention features two waveguides both integral with the housing which contains the resonant cavity. One waveguide has perturbations on its upper surface and the other waveguide has perturbations on its lower surface. This represents an improvement over the aforementioned co-pending application, having a single waveguide with perturbations on only the upper surface, since the present invention utilizes the energy otherwise incident upon the reflector and directs it to a second waveguide positioned on the opposite side of the housing. The second waveguide contains perturbations located on its lower surface. Thus, the two waveguides, when used as line scanners, provide dual beam line scanning in both upper and lower, or forward and rearward directions simultaneously.

In the preferred embodiment the waveguides are of semiconductor material such as silicon or gallium arsenide. The diode oscillator is either a Gunn or an IMPATT diode.

In a further embodiment of this invention a varactor is located proximate to the oscillator diode. As discussed below, tuning of the varactor while maintaining the oscillator diode bias constant, causes a variation in the radiated frequency, and thus causes a shift in the propagation angle of the radiation front. This varactor-tuning technique permits a more uniform radiated power output while still achieving the goal of electronic scanning.

The present invention therefore provides a simple low-cost millimeter-wave device which can operate as a dual beam line scanning device. The device provides millimeter wavelength radiation simultaneously in two different directions and the device may be tuned both mechanically and electronically or by a combination of both methods.

It is, therefore, an object of this invention to provide a compact, low-cost millimeter wave oscillator integrated with a dual beam antenna.

Another object is to provide a dual line scanning antenna with electronically controlled scanning.

It is a further object to provide a dual line scanning antenna with both mechanically and electronically controlled scanning.

It is yet another object to provide a dual beam antenna capable of providing conical beams by rotation.

DETAILED DESCRIPTION OF THE PREFERRED EMBODIMENTS

Figure 1:
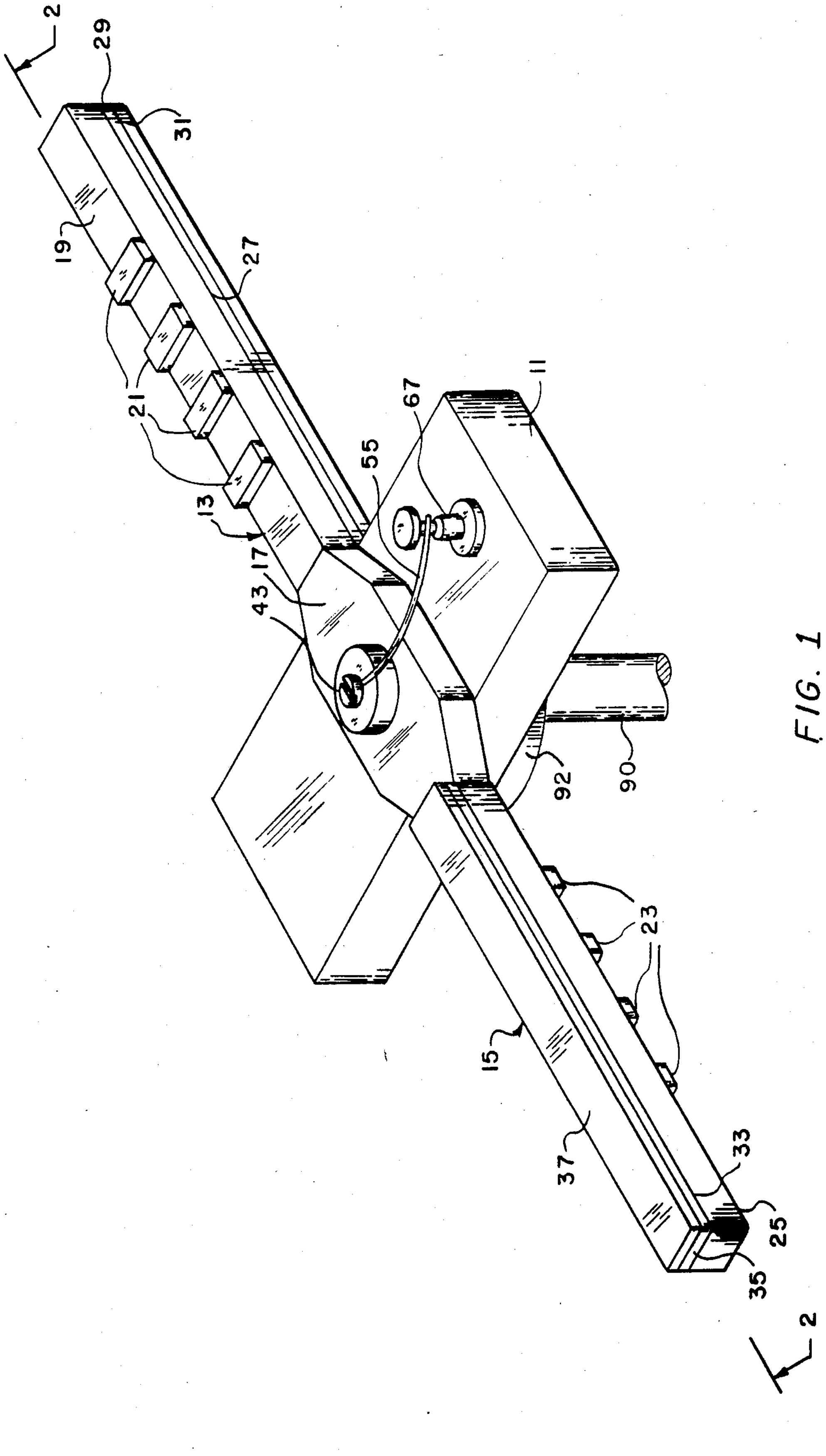
FIG. 1 is a perspective view generally illustrative of the present invention.

Referring to the drawings, and more particularly to FIG. 1, wherein like numerals refer to like components throughout, reference numeral 11 designates a mounting base. The base should be made of material with good heat conductive properties and, in the preferred embodiment, is comprised of brass. The first and second waveguides, 13 and 15, respectively, are attached to the oscillator housing 17. The oscillator housing 17 is supported by the base 11. The waveguides 13 and 15 are integral with the housing 17 and are all made of semiconductor material, preferably silicon or gallium arsenide. Each waveguide has a square cross section with approximately 1 millimeter sides and is approximately 10 centimeters long.

Attached to an upper surface 19 of the first waveguide 13 are a plurality of metal stripes or perturbations 21. The perturbations are equally spaced. Similarly, a plurality of equally space metal strips or perturbations 23 are attached to the lower surface 25 of the second waveguide 15.

Attached to the lower surface 27 of the first waveguide 13 and extending the entire width and breadth thereof is an insulation layer 29. A thin metal plate 31 is connected to and completely covers the lower surface of the insulation layer 29. The metal plate 31 and insulation layer 29 in combination provide a reflector for electromagnetic energy propagating through the waveguide 13 and serve to redirect energy which would otherwise radiate from the lower surface 27 of the waveguide 13 toward the upper surface 19 and the metal stripes 21. The redirected energy contributes to the beam radiated from the stripes 21. The reflector approximately doubles the amount of energy available for radiation from the metal stripes 21.

Attached to the upper surface 33 of the second waveguide 15 is an analogous insulation layer 35 and metal plate 37, the two in combination serving a reflective function similar to the corresponding plate 31 and insulation layer 29 on the first waveguide 13. Of course, the insulation layer 35 and metal plate 37 reflect energy downwards toward the stripes 23 on the lower surface of the second waveguide 15.

In one of the preferred embodiments, there are metallic stripes on each waveguide. Each stripe is 1.0 millimeters wide along the length of the guide and the leading-edge-to-leading edge spacing (indicated by "d" in FIG. 2) is 1.8 millimeters. Each waveguide (13 or 15) has a 1.0 millimeter square cross section. The length of each waveguide (13 or 15) is 100 millimeters. The total distance between the first and last stripe is 40 millimeters, and the series of stripes is positioned in the center of the guide, i.e. there is a 30 millimeter distance between the last stripe and the end of the guide and an equal 30 millimeter distance between the edge of the housing 17 and the first stripe. It is not necessary that the spacing between the perturbations on both waveguides be equal. If the spacing between the perturbations are different on the two waveguides, the angles of the two emitted beams will be unequal. The thickness of the insulating layer (29 or 35) is 0.240 millimeters. The insulating layer attached to the bottom of the waveguide is preferably a two-sided adhesive tape. The tape serves to attach the reflective metal plates to the bottom of the waveguide. Effective reflection could be accomplished without the tape, which is an insulator, but the tape is a convenient and effective method of securing the metal plate to the waveguide.

Figure 2:
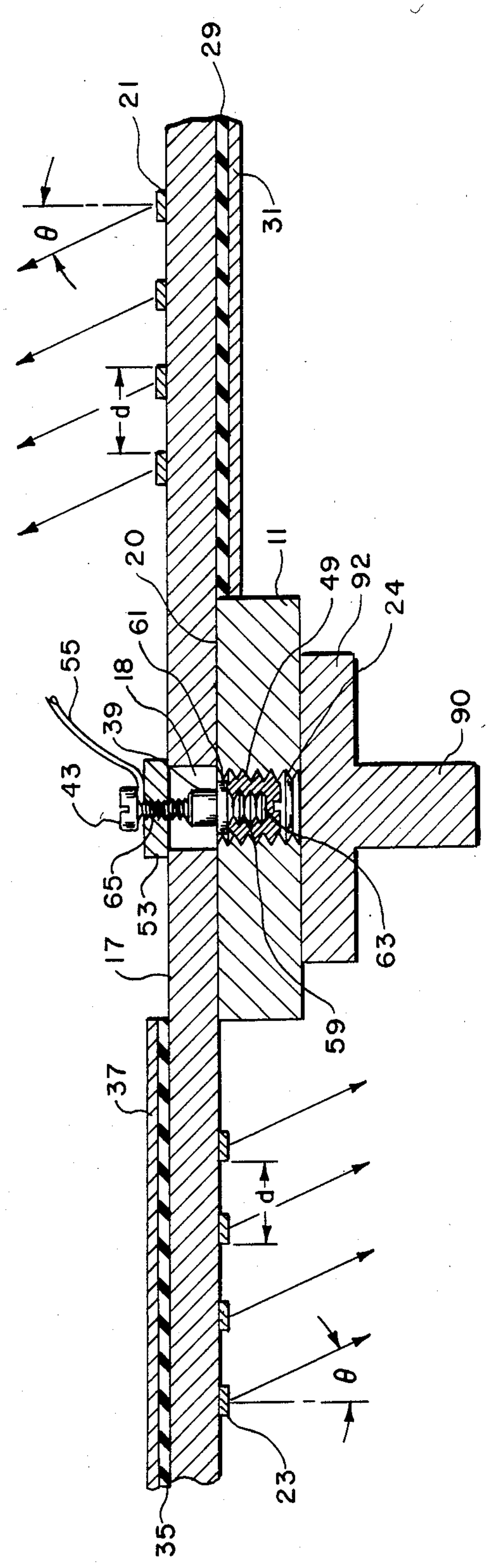
FIG. 2 is a side elevation cross-sectional view of the device of FIG. 1, cut along the line 2—2 and looking in the direction of the arrows.
Figure 3:
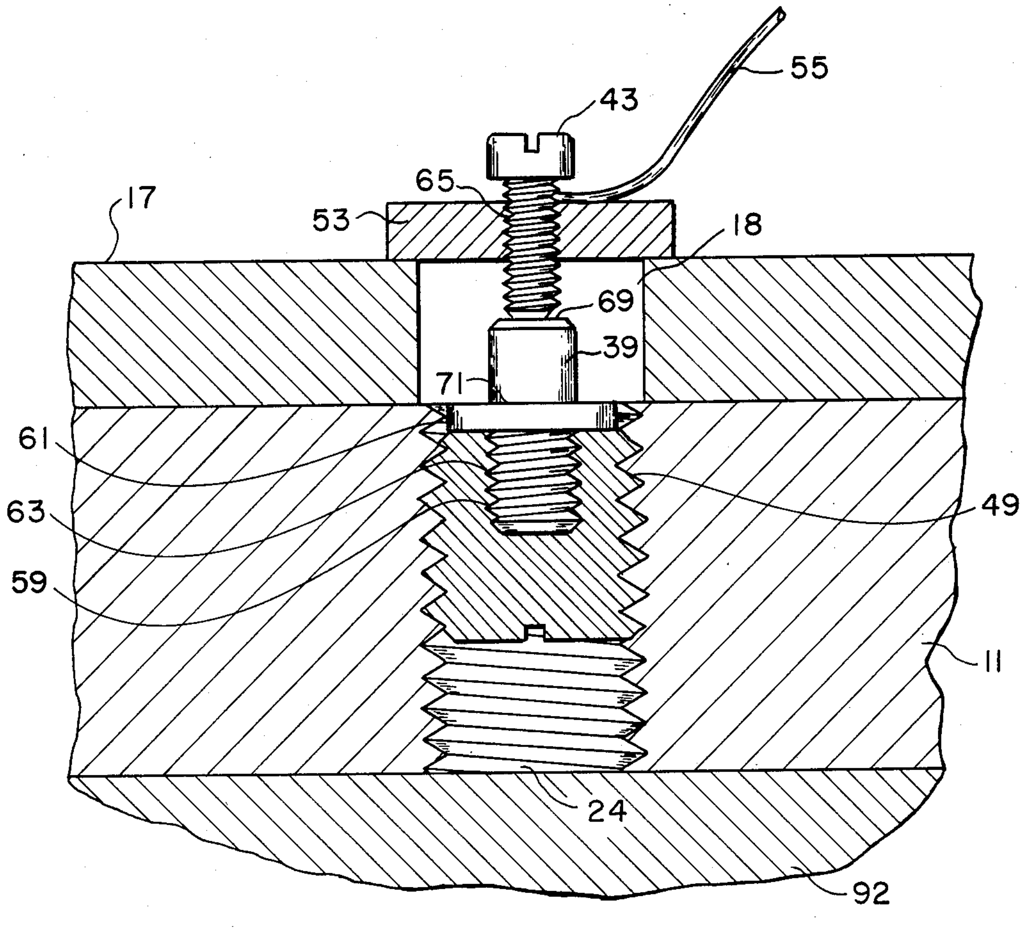
FIG. 3 is an enlarged sectional view in the same plane as FIG. 2 which shows the details of the oscillator mounting.

The housing 17 contains a vertical bore 18, shown in FIG. 2, which exposes a portion of the top surface 20 of the mounting base 11 beneath the housing 17. A threaded metal base bore 24 is defined in the mounting base 11 beneath the housing bore 18. A metallic threaded diode mounting cylinder 49 is inserted into the metal base bore 24. The mounting cylinder 49 contains a concentric threaded bore 59 (FIG. 3). The oscillator diode 39 is attached to a metallic diode support platform 61 which includes a threaded stem 63. The diode support threaded stem 63 is received in the threaded bore 59.

A metal cover 53 in the shape of a cylindrical disc is attached to the top of the housing 17 and the cover 53 provides a top closure for the housing bore 18. In the preferred embodiment the cover 53 is made of brass. The enclosed housing bore 18 defines a resonant cavity in which sustained oscillations are created by the oscillator diode 39. The metal cover 53 contains a threaded hole 65. A tuning screw 43 is inserted through the threaded hole 65 of the metal cover 53. The tuning screw 43 extends through the cover 53 and into the bore 18.

The diode 39 includes upper and lower electrical contact surfaces 69 and 71 respectively to which a DC bias voltage is connected. The lower diode surface is electrically connected to the mounting base 11 via the diode support platform 61 and the diode mounting cylinder 49. The mounting base 11 is connected to a first terminal of a DC bias source (not shown). The upper diode surface contacts the tuning screw 43. The tuning screw 43 contacts cover 53 which is connected by wire 55 to a second terminal of a DC bias source (not shown).

Alternatively, a standoff 67 is illustrated in FIG. 1. The standoff is mounted atop the mounting base 11, but is electrically insulated therefrom. The standoff 67 serves as a terminal post for the second terminal of the DC bias source. The standoff is electrically connected to the cover 53 and then to the tuning screw 43 by the wire 55.

When the oscillator diode 39 is energized, millimeter-wave oscillations are set up in the resonant cavity 18 and in the waveguides 13 and 15. Coordinated adjustment of both the tuning screw 43 and the diode mounting cylinder 49 permits raising or lowering of the diode 39 within the bore 18 while still maintaining electrical contact with the DC bias source. Raising or lowering of the diode 39 and its support platform 61 and stem 63 changes the geometry of the resonant cavity 18 and thus changes the wavelength of the radiation contained therein.

Thus, the wavelength of radiation entering the waveguide can be changed by two means: (a) by changing the physical dimensions of the resonant cavity as mentioned above, or (b) by changing the DC bias voltage.

The radiation pattern is directed at an angle $\sigma$ measured with respect to an axis normal to the radiating surface of the stripes. The angle of radiation is given by the formula:

$$\sin \sigma = (\lambda o/\lambda z) + (n\lambda o/d)$$

where

- d = perturbation spacing, leading edge to leading edge
- $\lambda o$ = free space wavelength at the oscillation frequency
- $\lambda z$ = waveguide wavelength in the direction of propagation
- n = −1

Examination of the formula shows that if $d = \lambda z$, that is, if the perturbation spacing is exactly equal to the waveguide wavelength, the radiation will be normal to the plane of the radiating antenna suface. If the perturbation spacing "d" is slightly less than the waveguide wavelength, the angle $\sigma$ will be negative, that is, the radiation pattern will shift toward the direction of incoming radiation, namely, toward the housing 17. On the other hand, if the perturbation spacing is slightly greater than the waveguide wavelength, $\sigma$ will be positive and the radiation pattern will shift away from the direction of incoming radiation, away from the housing 17.

The formula also indicates that, if the spacing between perturbations "d" is fixed, the angle $\sigma$ at which radiation is propagated may be varied by changing of the wavelength $\lambda g$ (or corresponding oscillator frequency accomplished by varying the DC bias of the oscillator diode). Thus, the device may be used as an electronic line scanner, providing two electronically-controlled beams emanating in opposite directions.

In a preferred embodiment, a frequency variation between 57 and 65 GHz produces a variation of from −68° (at 57 GHz) to −7° (at 65 GHz). The Gunn diode embodiment is biased at approximately 9 volts DC and 600 milliamperes. Alternatively, an IMPATT diode may be used and biased at 30 volts DC and 400 milliamperes.

Figure 4:
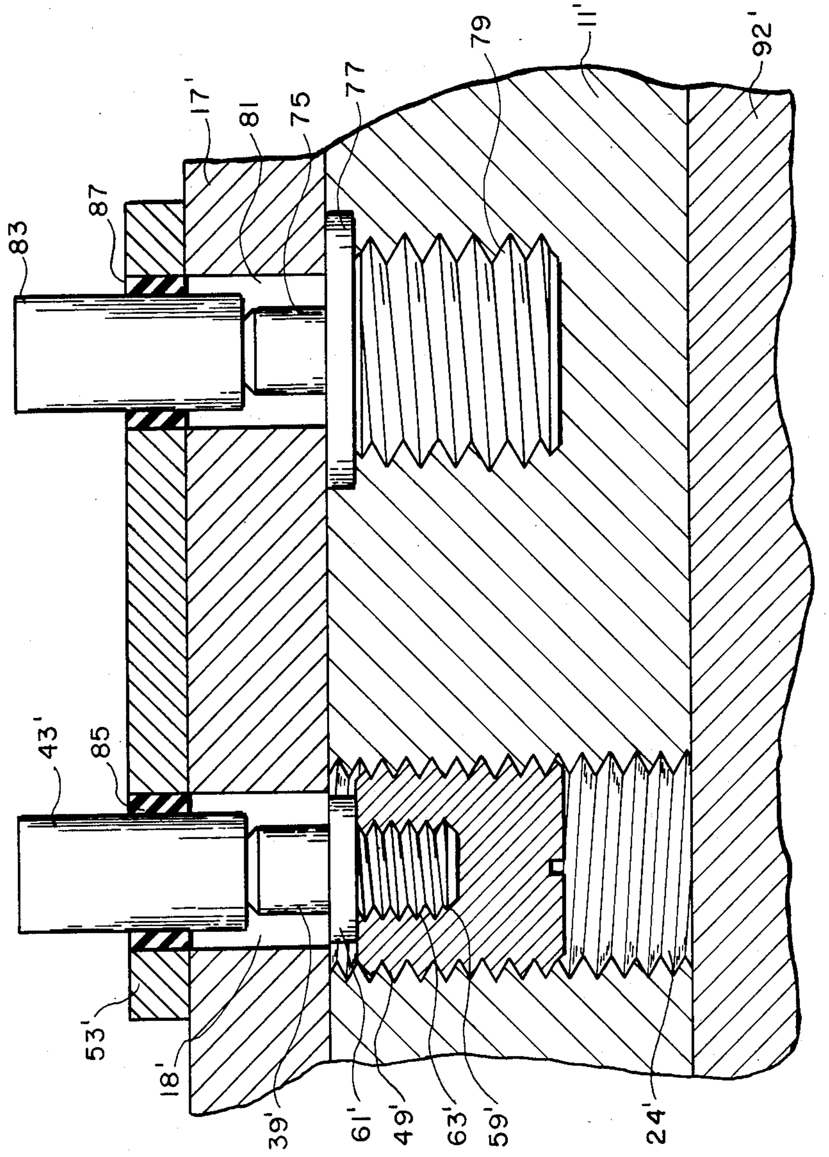
FIG. 4 is an enlarged sectional view of an alternative embodiment of the detail of FIG. 3.

An alternative means for controlling the frequency of the oscillator is illustrated in FIG. 4. As shown in this figure, a second bore 81 is defined in the housing 17'. The second bore 81 is positioned close to the bore 18' which contains the oscillator diode 39'. The second bore 81 admits a varactor 75. The varactor is supported on the metal base 77 and electrically contacted through the base 11' and through contact post 83. The varactor support structure 77 is positioned in the metal base 11' with a threaded stud 79.

The varactor 75 extends into the second bore 81 which is analogous to the resonant cavity 18 in FIG. 3. In both the oscillator resonant cavity 18' which includes a Gunn or IMPATT diode oscillator and in the varactor bore 81, respective contact post 43' and 83 are provided for making electrical contact with both the oscillator 39' and the varactor 75, thus providing independent DC bias for both. The varactor DC bias may be thus adjusted independently of the oscillator bias. The top metal cover 53' is employed in a manner similar to the aforementioned supporting and contacting structure utilized for the oscillator 39. The contact posts 43' and 83 are each insulated from the metal cover with thin concentric insulators 85 and 87. The oscillator 39' is supported within the cavity 18' in a manner analogous to that shown in FIG. 3. A threaded metal base bore 24' is defined in the mounting base 11'. A metallic threaded diode mounting cylinder 49' is inserted in the metal base bore 24'. The mounting cylinder 49' contains a concentric threaded bore 59'. The oscillator 39' is attached to a metallic diode support platform 61', which includes a threaded stem 63'. The threaded stem 63' is received in the threaded bore 59'.

The varactor diode 75 provides a capacitance which varies as the voltage applied to it is varied and hence reacts with the Gunn or IMPATT diode through the electromagnetic field generated by the oscillations of the diode oscillator to change the oscillator resonant frequency. Changing the oscillator resonant frequency changes the wavelength of radiation in the bore 18' and in the waveguides 13 and 15. Changing of the wavelength of radiation in the waveguides 13 and 15 causes a variation of the angle $\sigma$ at which radiation propagates from the stripes 21 and 23 on the upper and lower surfaces 19 and 25 respectively, of the two waveguides 13 and 15 to provide electronic beam scanning. Varactor tuning as described above is advantageous because it does not require any change in the DC bias of the oscillator, which maybe a Gunn or IMPATT diode. Great variation in the bias of a Gunn or IMPATT diode causes variation of power output. Varactor tuning permits oscillator power to remain constant while providing the wide angular scan in two opposite directions.

As shown in FIG. 2, the device may be equipped with an axle 90 attached to the mounting base 11 via a support collar 92 or by other means. Rotation of the entire assembly around the vertical axis of the axle 90 together with electronic variation of the line-scanning angle, provides roughly conical-shaped radiation coverage directed in two opposite directions.

The illustrative embodiments presented herein represent only a limited number of possible variations which will occur to those skilled in the art while using the inventive principles contained herein. Accordingly, many other variations of the invention are possible while staying within the spirit and scope of the invention as defined in the following claims.

What is claimed is:

1. A dual beam antenna comprising:
a housing;
first and second longitudinally disposed dielectric waveguides mounted on and extending from opposite ends of said housing and adapted to propagate electromagnetic waves along the length of said waveguides;
a first plurality of transverse perturbations evenly spaced along a top wave radiating surface of said first waveguide;
a second plurality of transverse perturbations evenly spaced along a bottom wave radiating surface of said second waveguide;
a resonant cavity within said housing between said waveguides;
adjustable oscillator means disposed within said resonant cavity for generating variable electromagnetic waves along said waveguides and radiating said waves outwardly from said top and bottom surfaces; and
means for controlling the frequency of said oscillator and angle of radiation of said waves from said waveguide surfaces.

2. The device of claim 1 wherein said housing and waveguides are of semiconductor material, each of said waveguides being rectangular and having flat top and bottom surfaces; and
further comprising a layer of reflective material mounted on said bottom surface of said first waveguide; and
a layer of reflective material mounted on said top surface of said second waveguide.

3. The device of claim 2 wherein said reflective layers include a layer of insulation on said waveguide surfaces and a metal layer on said layer of insulation.

4. The device of claim 1 wherein said first and second pluralities of perturbations are metal stripes.

5. The device of claim 1 wherein said oscillator means is a Gunn diode.

6. The device of claim 1 wherein said oscillator means is an IMPATT diode.

7. The device of claim 1 wherein said first and second dielectric waveguides are made of silicon.

8. The device of claim 1 wherein said first and second waveguides are made of gallium arsenide.

9. A dual beam antenna comprising:
a housing;
a metal base supporting said housing,
first and second semiconductor waveguides supported on said housing and extending longitudinally from opposite ends of said housing, each waveguide having a rectangular cross section adapted to propagate electromagnetic waves along the length of said waveguide, each of said waveguides having top and bottom flat parallel surfaces;
a first plurality of transverse metal stripes evenly spaced along a top wave radiating surface of said first waveguide;
a second plurality of transverse metal stripes evenly spaced along a bottom wave radiating surface of said second waveguide;
a resonant cavity within said housing and metal base between said waveguides;
an oscillator adjustably mounted within said resonant cavity, said oscillator including a bottom surface in electrical contact with said metal base and an upper surface extending within said resonant cavity;
means for providing bias voltage to said upper surface of said oscillator, and
tuning means for varying the frequency of said oscillator and angle of radiation of said waves from said top and bottom radiating surfaces.

10. The device of claim 9 wherein said tuning means includes means for varying said bias voltage.

11. The device of claim 9 wherein said tuning means includes a second resonant cavity within said housing and base, a varactor diode within said second cavity, and means for applying a variable direct voltage bias to said varactor diode.

12. The device of claim 9 where said tuning means comprises a metal screw contacting said upper surface of said oscillator, a metal top closure for said resonant cavity and a wire electrically connected to said metal top closure.

13. The device of claim 9 including a second resonant cavity within said housing and metal base, a varactor mounted within said second cavity, said varactor including a bottom surface in electrical contact with said metal base and an upper surface opposite said bottom surface; and
second means for providing bias voltage to said upper surface of said varactor.

14. The device of claim 9 wherein said oscillator is a Gunn diode.

15. The device of claim 9 wherein said oscillator is an IMPATT diode.

16. The device of claim 9 including means for rotatably mounting said metal base to permit rotation of said waveguides and provide a conical radiation of said waves in opposite directions from said top and bottom radiating surfaces.

* * * * *